(12) United States Patent
Cho et al.

(10) Patent No.: US 8,619,406 B2
(45) Date of Patent: Dec. 31, 2013

(54) SUBSTRATE SUPPORTS FOR SEMICONDUCTOR APPLICATIONS

(75) Inventors: Jaeyong Cho, Wappingers Falls, NY (US); John Sirman, Anthem, AZ (US)

(73) Assignee: FM Industries, Inc., Fremont, CA (US)

( * ) Notice: Subject to any disclaimer, the term of this patent is extended or adjusted under 35 U.S.C. 154(b) by 213 days.

(21) Appl. No.: 13/117,262

(22) Filed: May 27, 2011

(65) Prior Publication Data
US 2012/0141661 A1 Jun. 7, 2012

Related U.S. Application Data

(60) Provisional application No. 61/349,544, filed on May 28, 2010.

(51) Int. Cl.
*H01T 23/00* (2006.01)
(52) U.S. Cl.
USPC .......................................................... 361/234
(58) Field of Classification Search
USPC .......................................................... 361/234
See application file for complete search history.

(56) References Cited

U.S. PATENT DOCUMENTS

| | | | |
|---|---|---|---|
| 3,016,447 A | 1/1962 | Gage et al. | |
| 4,519,840 A | 5/1985 | Jackson et al. | |
| 4,626,476 A | 12/1986 | Londry et al. | |
| 6,391,146 B1 * | 5/2002 | Bhatnagar et al. | 156/345.29 |
| 6,452,775 B1 | 9/2002 | Nakajima | |
| 6,503,290 B1 | 1/2003 | Jarosinski et al. | |
| 6,581,275 B2 * | 6/2003 | Narendrnath et al. | 29/825 |
| 7,369,393 B2 | 5/2008 | Zandi et al. | |
| 7,442,450 B2 | 10/2008 | Aihara et al. | |
| 2003/0123213 A1 | 7/2003 | Kosakai | |
| 2008/0151467 A1 | 6/2008 | Simpson | |
| 2008/0174930 A1 | 7/2008 | Hattori et al. | |
| 2009/0161285 A1 | 6/2009 | Abouaf et al. | |
| 2010/0003510 A1 | 1/2010 | Kano et al. | |
| 2010/0039747 A1 | 2/2010 | Sansoni et al. | |

FOREIGN PATENT DOCUMENTS

| | | |
|---|---|---|
| JP | 2008-227420 | 9/2008 |
| JP | 2008-300374 | 11/2008 |

* cited by examiner

*Primary Examiner* — Stephen W Jackson
(74) *Attorney, Agent, or Firm* — Burr & Brown, PLLC

(57) ABSTRACT

This invention relates to substrate supports, e.g., coated electrostatic chucks, having a dielectric multilayer formed thereon; dielectric multilayers that provide erosive and corrosive barrier protection in harsh environments such as plasma treating vessels used in semiconductor device manufacture; process chambers, e.g., deposition chambers, for processing substrates; methods for protecting substrate supports; and methods for producing substrate supports and electronic devices. The dielectric multilayer comprises (a) an undercoat dielectric layer comprising a metal oxide or metal nitride formed on a surface; and (b) a topcoat dielectric layer comprising a metal oxide formed on the undercoat dielectric layer. The topcoat dielectric layer has an aluminum oxide content of less than about 1 weight percent. The topcoat dielectric layer has a corrosion resistance and/or plasma erosion resistance greater than the corrosion resistance and/or plasma erosion resistance of the undercoat dielectric layer. The undercoat dielectric layer can have a resistivity greater than the resistivity of the topcoat dielectric layer. The topcoat dielectric layer can have a dielectric constant greater than the dielectric constant of the undercoat dielectric layer. The undercoat dielectric layer can have a porosity greater than the porosity of the topcoat dielectric layer. The invention is useful, for example, in the manufacture and protection of electrostatic chucks used in semiconductor device manufacture.

25 Claims, 4 Drawing Sheets

SUBSTRATE SUPPORTS FOR SEMICONDUCTOR APPLICATIONS

RELATED APPLICATIONS

The present application claims priority to U.S. Provisional Application Ser. No. 61/349,544, filed May 28, 2010, which is incorporated by reference herein in its entirety.

FIELD OF THE INVENTION

This invention relates to substrate supports, e.g., electrostatic chucks, having a dielectric multilayer formed thereon; dielectric multilayers that provide erosive and corrosive barrier protection in harsh environments such as plasma treating vessels used in semiconductor device manufacture; process chambers, e.g., deposition chambers, for processing substrates; methods for protecting substrate supports; and methods for producing substrate supports and electronic devices. The invention is useful, for example, in the manufacture and protection of electrostatic chucks used in semiconductor device manufacture.

BACKGROUND OF THE INVENTION

Electrostatic chucks are widely used to hold substrates, such as semiconductor wafers, in stationary position during substrate processing in processing chambers used for various applications, such as physical vapor deposition, etching, or chemical vapor deposition. Typically, electrostatic chucks contain one or more electrodes embedded within a dielectric material such as ceramic. As power is applied to the electrode, an attractive force is generated between the electrostatic chuck and the substrate disposed thereon.

The attractive force is commonly generated through either a Coulombic or a Johnsen-Rahbek effect. Generally, electrostatic chucks utilizing Coulombic attraction have electrodes disposed in bodies having high resistivities. The insulating properties of the body maintain a capacitive circuit (i.e., charge separation) between the electrodes and the substrate when an electrical potential is applied between them. Electrostatic chucks utilizing Johnsen-Rahbek attraction have electrodes disposed in bodies having lower resistivities which allow charge migration through the body when power is applied to the electrodes.

Charges (i.e., electrons) within the body migrate to portions of the surface of the electrostatic chuck making contact with the substrate when voltage is applied to the electrodes. Some minimal current passes between the chuck surface and the substrate at the contact point but generally not enough to result in device damage. Thus, as the charges accumulate at both sides of the contact points, a highly localized and powerful electric field is established between the substrate and electrostatic chuck. Since the attractive force is proportional to the distance between the opposite charges, the substrate is secured to the chuck with less power than necessary in chucks comprising high resistivity material (i.e., chucks having solely Coulombic attraction) as charge accumulates on the chuck's support surface close to the substrate.

As electrostatic chucks generally rely on the electric potential developed between the embedded electrodes and the substrate for the generation of attractive force, prevention of current leakage through the chuck body is important. For example, in a Johnsen-Rahbek electrostatic chuck, plasma may contact the surface of the electrostatic chuck. As the plasma provides a current path between the electrostatic chuck and the chamber sidewalls that are normally grounded, the movement of charge through the body is diverted from the support surface to ground, substantially reducing the charge accumulation on the support surface resulting in diminished or lost attractive force. As the attractive force is decreased or lost, the substrate may move or become dislodged. A dislodged substrate is likely to become damaged or improperly processed. Current leakage from this or other reasons through the sides or bottom of the electrostatic chuck has a similar effect.

Problems associated with a Johnsen-Rahbek type electrostatic chuck include, for example, undesired leakage current, variation in electrostatic attraction force depending on the type of substrate being held by the electrostatic chuck, and difficulty in detaching the substrate from the electrostatic chuck, i.e., de-chucking, after removing the power supply.

Problems associated with a Coulombic type electrostatic chuck include, for example, insufficient resistance to erosive and corrosive conditions, e.g., corrosive gases, such as those that exist in semiconductor device manufacture.

Therefore, a need exists for improved electrostatic chucks having reduced leakage current and improved chucking and de-chucking performance through the operational life of the electrostatic chuck. Also, a need exists for electrostatic chucks having improved erosion and corrosion resistance in severe conditions, e.g., plasma, such as those that exist in semiconductor device manufacture.

SUMMARY OF THE INVENTION

This invention relates in part to a substrate support comprising (i) a base body; (ii) one or more conductive members disposed on or within the base body; and (iii) a dielectric multilayer formed on at least a portion of the base body, or on the one or more conductive members disposed on the base body and at least a portion of the base body; wherein the dielectric multilayer comprises (a) an undercoat dielectric layer comprising a metal oxide or metal nitride formed on at least a portion of the base body, or on the one or more conductive members disposed on the base body and at least a portion of the base body; and (b) a topcoat dielectric layer comprising a metal oxide formed on the undercoat dielectric layer; wherein (i') the topcoat dielectric layer has an aluminum oxide content of less than about 1 weight percent, and (ii') the topcoat dielectric layer has a corrosion resistance and/or plasma erosion resistance greater than the corrosion resistance and/or plasma erosion resistance of the undercoat dielectric layer.

This invention also relates in part to a dielectric multilayer comprising (a) an undercoat dielectric layer comprising a metal oxide or metal nitride formed on a surface; and (b) a topcoat dielectric layer comprising a metal oxide formed on the undercoat dielectric layer; wherein (i) the undercoat dielectric layer has a resistivity greater than the resistivity of the topcoat dielectric layer, (ii) the topcoat dielectric layer has a corrosion resistance and/or plasma erosion resistance greater than the corrosion resistance and/or plasma erosion resistance of the undercoat dielectric layer, (iii) the topcoat dielectric layer has a dielectric constant greater than the dielectric constant of the undercoat dielectric layer, and (iv) the undercoat dielectric layer has a porosity greater than the porosity of the topcoat dielectric layer.

This invention further relates in part to a process chamber for processing a substrate, the process chamber comprising: (a) an evacuable chamber defining an interior volume, (b) a gas supply fluidly coupled to the interior volume, and (c) an electrostatic chuck positioned in the interior volume comprising (i) a base body; (ii) one or more conductive members disposed on or within the base body; and (iii) a dielectric multilayer formed on at least a portion of the base body, or on the one or more conductive members disposed on the base body and at least a portion of the base body; wherein the dielectric multilayer comprises (a') an undercoat dielectric layer comprising a metal oxide or metal nitride formed on at least a portion of the base body, or on the one or more conductive members disposed on the base body and at least a portion of the base body; and (b') a topcoat dielectric layer comprising a metal oxide formed on the undercoat dielectric layer; wherein (i') the topcoat dielectric layer has an aluminum oxide content of less than about 1 weight percent, and (ii') the topcoat dielectric layer has a corrosion resistance and/or plasma erosion resistance greater than the corrosion resistance and/or plasma erosion resistance of the undercoat dielectric layer.

This invention yet further relates in part to a method for protecting a substrate support, the substrate support comprising a base body, and one or more conductive members disposed on or within the base body; the method comprising forming a dielectric multilayer on at least a portion of the base body, or on the one or more conductive members disposed on the base body and at least a portion of the base body; wherein the dielectric multilayer comprises (a) an undercoat dielectric layer comprising a metal oxide or metal nitride formed on at least a portion of the base body, or on the one or more conductive members disposed on the base body and at least a portion of the base body; and (b) a topcoat dielectric layer comprising a metal oxide formed on the undercoat dielectric layer; wherein (i) the topcoat dielectric layer has an aluminum oxide content of less than about 1 weight percent, and (ii) the topcoat dielectric layer has a corrosion resistance and/or plasma erosion resistance greater than the corrosion resistance and/or plasma erosion resistance of the undercoat dielectric layer.

This invention also relates in part to a method for producing a substrate support comprising (a) providing a base body, and one or more conductive members disposed on or within the base body; and (b) forming a dielectric multilayer on at least a portion of the base body, or on the one or more conductive members disposed on the base body and at least a portion of the base body; wherein the dielectric multilayer comprises (i) an undercoat dielectric layer comprising a metal oxide or metal nitride formed on at least a portion of the base body, or on the one or more conductive members disposed on the base body and at least a portion of the base body; and (ii) a topcoat dielectric layer comprising a metal oxide formed on the undercoat dielectric layer; wherein (a') the topcoat dielectric layer has an aluminum oxide content of less than about 1 weight percent, and (b') the topcoat dielectric layer has a corrosion resistance and/or plasma erosion resistance greater than the corrosion resistance and/or plasma erosion resistance of the undercoat dielectric layer.

This invention further relates in part to a method for producing an electronic device, the method comprising: (a) providing an electrostatic chuck comprising (i) a base body; (ii) one or more conductive members disposed on or within the base body; and (iii) a dielectric multilayer formed on at least a portion of the base body, or on the one or more conductive members disposed on the base body and at least a portion of the base body; wherein the dielectric multilayer comprises (a') an undercoat dielectric layer comprising a metal oxide or metal nitride formed on at least a portion of the base body, or on the one or more conductive members disposed on the base body and at least a portion of the base body; and (b') a topcoat dielectric layer comprising a metal oxide formed on the undercoat dielectric layer; wherein (i') the topcoat dielectric layer has an aluminum oxide content of less than about 1 weight percent, and (ii') the topcoat dielectric layer has a corrosion resistance and/or plasma erosion resistance greater than the corrosion resistance and/or plasma erosion resistance of the undercoat dielectric layer; (b) providing a workpiece overlying the work surface; (c) providing a voltage across the electrostatic chuck and the workpiece to maintain the workpiece in proximity to the work surface; and (d) processing the workpiece to produce an electronic device.

This invention provides coated substrate supports, e.g., coated electrostatic chucks, in which the coating can minimize current leakage from the electrostatic chuck, eliminate concern about the electrostatic attraction force varying depending on the type of workpiece mounted on the support surface, advantageously enhance the attractive or chucking force, and also facilitate de-chucking.

This invention also provides coated substrate supports, e.g., coated electrostatic chucks, that have improved erosion and corrosion resistance, and that reduce the level of erosive and corrosive attack by process reagents. Particularly, this invention provides corrosion and erosion resistance to coated substrate supports, i.e., electrostatic chucks, in plasma treating vessels used in semiconductor device manufacture, e.g., metal and dielectric etch processes. The coating on the substrate supports also exhibits low particle generation, low metals contamination, and desirable thermal, electrical and adhesion characteristics.

DETAILED DESCRIPTION OF THE INVENTION

Figure 1:
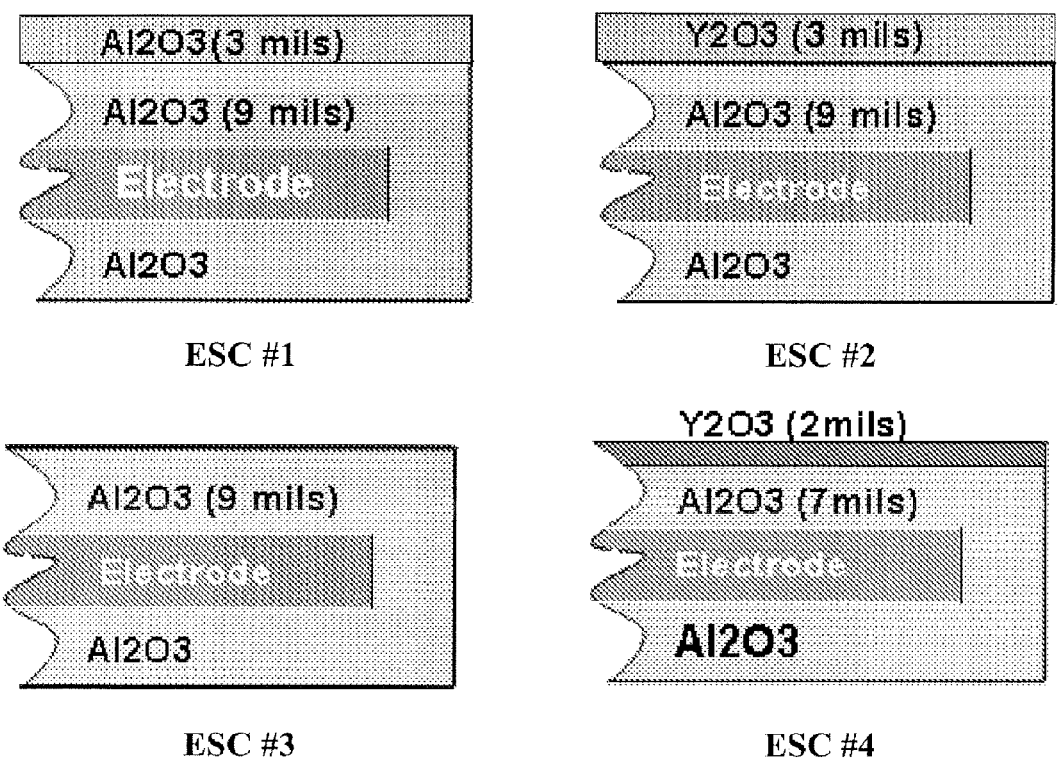
FIG. 1 depicts in cross section four different electrostatic chucks (ESCs) for a 300 mm wafer that were fabricated to compare chucking force in Example 1. ESC #1 depicts an Al2O3 undercoat layer (9 mils) and an Al2O3 topcoat layer (3 mils). ESC #2 depicts an Al2O3 undercoat layer (9 mils) and a Y2O3 topcoat layer (3 mils). ESC #3 depicts a single Al2O3 layer (9 mils). ESC #4 depicts an Al2O3 undercoat layer (7 mils) and a Y2O3 topcoat layer (2 mils).

In addition to minimizing current leakage from the electrostatic chuck, eliminating concern about the electrostatic attraction force varying depending on the type of workpiece mounted on the support surface, advantageously enhancing the attractive or chucking force, and also facilitating de-chucking, this invention can minimize substrate support damage due to chemical corrosion through a halogen gas and also damage due to plasma erosion. When a substrate support is used in an environment containing the halogen excited by the plasma, it is important to prevent plasma erosion damage caused by ion bombardment, which is then effective to prevent the chemical corrosion caused by halogen species. Byproducts generated from the process reactions include halogen compounds such as chlorides, fluorides and bromides. When exposed to atmosphere or wet cleaning solutions during the cleaning cycles, the byproducts can react to form corrosive species such as AlF, HCl and HF.

Illustrative substrate support bodies useful in this invention include, for example, electrostatic chuck bodies. A substrate support useful in this invention comprises (i) a base body; (ii) one or more conductive members disposed on or within the base body; and (iii) a dielectric multilayer formed on at least a portion of the base body, or on the one or more conductive members disposed on the base body and at least a portion of the base body. Another useful substrate support comprises (i) a support surface on which a substrate is supported, a mounting surface disposed opposite the support surface, and at least one side separating the support surface and the mounting surface; and (ii) one or more conductive members, e.g., electrodes, disposed on or within the body. Such substrate support bodies, e.g., electrostatic chucks, (without the dielectric multilayer of this invention) are conventional materials known in the art.

In accordance with this invention, a specific dielectric multilayer is disposed on at least the support surface of the substrate support body. The dielectric multilayer comprises (a) an undercoat dielectric layer comprising a metal oxide or metal nitride formed on a surface; and (b) a topcoat dielectric layer comprising a metal oxide formed on the undercoat dielectric layer. The topcoat dielectric layer has an aluminum oxide content of less than about 1 weight percent, preferably less than about 0.5 weight percent, and more preferably less than about 0.1 weight percent. The topcoat dielectric layer has a corrosion resistance and/or plasma erosion resistance greater than the corrosion resistance and/or plasma erosion resistance of the undercoat dielectric layer. The undercoat dielectric layer can have a resistivity greater than the resistivity of the topcoat dielectric layer. The topcoat dielectric layer can have a dielectric constant greater than the dielectric constant of the undercoat dielectric layer. The undercoat dielectric layer can have a porosity greater than the porosity of the topcoat dielectric layer.

Illustrative electrostatic chuck bodies (without the dielectric multilayer of this invention) are conventional devices known in the art. Illustrative devices are described, for example, in U.S. Patent Application Publication No. 2003/0123213 A1, published Jul. 3, 2003; U.S. Patent Publication No. 2008/0151467 A1, published Jun. 26, 2008; U.S. Patent Publication No. 2010/0039747 A1, published Feb. 18, 2010; U.S. Patent Publication No. 2009/0161285 A1, published Jun. 25, 2009; U.S. Patent Publication No. 2002/0036373 A1, published Mar. 28, 2002; U.S. Pat. No. 6,452,775; U.S. Pat. No. 7,369,393; U.S. Pat. No. 7,442,450 B2; the disclosures of which are incorporated herein by reference.

In an embodiment, this invention relates to a process chamber having an electrostatic chuck disposed therein. The electrostatic chuck includes a dielectric multilayer that minimizes current leakage from the electrostatic chuck, eliminates concern about the electrostatic attraction force varying depending on the type of workpiece mounted on the support surface, advantageously enhances the attractive or chucking force, and also facilitates de-chucking. The coated electrostatic chuck also exhibits desired plasma resistance and resistance to corrosive gases. The invention has utility in process chambers including plasma chambers, physical vapor deposition chambers, chemical vapor deposition chambers, atomic layer deposition chambers, etch chambers and other applications where electrostatic chucking of a substrate is desired.

In particular, this invention relates a process chamber for processing a substrate. The process chamber comprises (a) an evacuable chamber defining an interior volume, (b) a gas supply fluidly coupled to the interior volume, and (c) an electrostatic chuck positioned in the interior volume. The electrostatic chuck comprises (i) a base body; (ii) one or more conductive members disposed on or within the base body; and (iii) a dielectric multilayer formed on at least a portion of the base body, or on the one or more conductive members disposed on the base body and at least a portion of the base body. The dielectric multilayer comprises (a') an undercoat dielectric layer comprising a metal oxide or metal nitride formed on at least a portion of the base body, or on the one or more conductive members disposed on the base body and at least a portion of the base body; and (b') a topcoat dielectric layer comprising a metal oxide formed on the undercoat dielectric layer. The topcoat dielectric layer has an aluminum oxide content of less than about 1 weight percent, preferably less than about 0.5 weight percent, and more preferably less than about 0.1 weight percent. The topcoat dielectric layer has a corrosion resistance and/or plasma erosion resistance greater than the corrosion resistance and/or plasma erosion resistance of the undercoat dielectric layer. The undercoat dielectric layer can have a resistivity greater than the resistivity of the topcoat dielectric layer. The topcoat dielectric layer can have a dielectric constant greater than the dielectric constant of the undercoat dielectric layer. The undercoat dielectric layer can have a porosity greater than the porosity of the topcoat dielectric layer.

In accordance with this invention, it has been found that by forming on the electrostatic chuck surface a specific dielectric multilayer comprising (a) an undercoat dielectric layer comprising a metal oxide or metal nitride formed on a surface; and (b) a topcoat dielectric layer comprising a metal oxide formed on the undercoat dielectric layer; wherein (i) the topcoat dielectric layer has an aluminum oxide content of less than about 1 weight percent; and (ii) the topcoat dielectric layer has a corrosion resistance and/or plasma erosion resistance greater than the corrosion resistance and/or plasma erosion resistance of the undercoat dielectric layer; the problems identified hereinabove are effectively solved.

In an electrostatic chuck, the chucking of a wafer can be achieved using a Coulombic force or Johnsen-Rahbek effect. Chucks using a Johnsen-Rahbek effect use a resistive layer between the electrode and the workpiece, particularly in workpieces that are semiconductive or conductive. The resistive layer has a particular resistivity, typically less than about 1E10 ohms-cm, to allow charges within the resistive layer to migrate during operation. That is, during operation of a Johnsen-Rahbek effect electrostatic chuck, charges within the resistive layer migrate to the surface of the chuck and charges from the workpiece migrate toward the bottom surface thereby generating the necessary attractive electrostatic force. In contrast, electrostatic chucks utilizing a Coulombic effect rely upon the embedded electrode as essentially one plate of a capacitor and the workpiece (or plasma) as the second plate of a capacitor, and a dielectric material between the plates. When a voltage is applied across the workpiece and the electrode, the workpiece is attracted to the surface of the chuck.

In an embodiment of this invention, as a result of the undercoat dielectric layer having a resistivity of greater than about 1E16 ohms-cm, the Coulombic force is dominant over the Johnsen-Rahbek effect. Thus, charging up of the attachment surface does not occur easily when plasma processing is performed, plasma resistance is improved significantly, and resistance to corrosive gases is also improved.

In another embodiment of this invention, as a result of the undercoat dielectric layer having a resistivity of less than about 1E16 ohms-cm, the Johnsen-Rahbek force is dominant over the Coulombic effect. Thus, charging up of the attachment surface occurs easily when plasma processing is performed (i.e., lower resistivities allow charge migration through the electrostatic chuck body when power is applied to the electrodes), plasma resistance is improved significantly, and resistance to corrosive gases is also improved.

In operation, the semiconductor substrate is placed on the substrate support and gaseous components are supplied from a gas panel to the process chamber through entry ports to form a gaseous mixture. The gaseous mixture is ignited into a plasma in the process chamber by applying power from a power source. The pressure within the interior of the chamber can be controlled using a valve. The temperature at the surface of the chamber walls can be controlled using liquid-containing conduits that are located in the walls of the chamber. Chemically reactive ions are released from the plasma and strike the substrate; thereby removing exposed material from the substrate's surface.

To promote a uniform temperature across a substrate that is retained by the electrostatic chuck, a gas (e.g., helium or argon) can be introduced to a plenum defined between a support surface of the electrostatic chuck and the substrate to provide a heat transfer medium therebetween. The gas is generally applied to the plenum through one or more outlets formed through the chuck body. The temperature of the substrate can be controlled by stabilizing the temperature of the electrostatic chuck and flowing helium or other gas from a gas source to the plenum defined between the substrate and a support surface of the electrostatic chuck.

The electrostatic chuck is generally circular in form but may alternatively comprise other geometries to accommodate non-circular substrates, for example, square or rectangular flat panels. The electrostatic chuck generally includes one or more electrodes on or embedded within a support body. The electrodes are typically comprised of an electrically conductive material such as copper, graphite and the like. Typical electrode structures include, but are not limited to, a pair of coplanar D-shaped electrodes, coplanar interdigital electrodes, a plurality of coaxial annular electrodes, a singular, circular electrode or other structure. The electrodes are coupled to a power source.

The electrostatic chuck body may comprise aluminum, ceramic, dielectric or a combination of one or more of the aforementioned materials. In an embodiment, the chuck body can be fabricated from a high resistivity ceramic material (i.e., a material having a resistivity equal to or greater than about 1E11 ohms-cm). Examples of high resistivity materials include doped ceramics such as alumina doped with titanium oxide or chromium oxide, doped aluminum oxide, doped boron-nitride and the like. Other materials of comparable resistivity, for example, aluminum nitride, may also be used.

The undercoat dielectric layer of the dielectric multilayer has a substantially higher resistivity than the topcoat dielectric layer of the dielectric multilayer, and the material comprising the chuck body. The undercoat dielectric layer has a resistivity greater than about 10E16 ohms-cm when the substrate support is adapted to make use of a Coulombic force. The undercoat dielectric layer has a resistivity of from about 10E11 ohms-cm to about 10E14 ohms-cm when the substrate support is adapted to make use of a Johnsen-Rahbek force. The resistivity of the topcoat dielectric layer can vary over a wide range. Preferably the topcoat dielectric layer has a lower resistivity than the undercoat dielectric layer. Depending on whether to make use of a Coulombic force or a Johnsen-Rahbek force, the undercoat dielectric layer can have a resistivity sufficient to prevent or allow current draw through the undercoat dielectric layer. For purposes of this invention, "resistivity" is measured by ASTM D 257-07.

The topcoat dielectric layer of the dielectric multilayer is an electrically insulating material having a dielectric constant greater than about 8, preferably greater than about 10, and more preferably greater than about 12. The undercoat dielectric layer of the dielectric multilayer is also an electrically insulating material having a dielectric constant that can vary over a wide range. The dielectric constant of the topcoat dielectric layer is greater than the dielectric constant of the undercoat dielectric layer. The undercoat dielectric layer prevents free charge transfer through the dielectric with high resistivity. The topcoat layer is utilized to increase polarization of dipoles inside of the dielectric layer to increase chucking force with a high dielectric constant. For purposes of this invention, "dielectric constant" is measured by ASTM D 150-98.

Helium gas leak can be used as an indicator of chucking force in an electrostatic chuck application that uses helium gas for a heat transfer medium in between the electrostatic chuck surface and the wafer on the surface. For example, a severe process using an electrostatic chuck in a semiconductor or flat panel fabrication is a dielectric etching process. In such a process, more than 20 Ton of helium gas is used and the leak rate of helium gas is monitored during the process. If the leak rate is higher than a predetermined number, e.g., higher than 5 to 10 sccm, the process is aborted due to potential wafer pop off because of the high helium pressure.

The porosity of the dielectric multilayer of this invention should be sufficient to accommodate any expansion of the substrate support construction material at high temperature and prevent cracking of the undercoat layer. The undercoat dielectric layer of the dielectric multilayer has a porosity sufficient to provide a compliant thermal expansion coefficient between the metal or non-metal substrate, e.g., electrostatic chuck, and the dielectric multilayer.

The undercoat dielectric layer of the dielectric multilayer typically has a porosity greater than about 5%. The topcoat dielectric layer of the dielectric multilayer has a porosity that can vary over a wide range. Preferably the topcoat dielectric layer has a lower porosity than the undercoat dielectric layer. For purposes of this invention, "porosity" is measured by ASTM E 2109.

As indicated above, the undercoat dielectric layer has a porosity sufficient to provide a compliant thermal expansion coefficient between the metal or non-metal substrate, e.g., electrostatic chuck, and the dielectric multilayer. The undercoat dielectric layer is a compliant material capable of withstanding stresses due to the thermal expansion coefficient mismatch between the metal or non-metal substrate and the dielectric multilayer. This mismatch in thermal expansion coefficient between the undercoat dielectric layer and the metal or non-metal substrate can lead to crack propagation at the undercoat dielectric layer/substrate interface. An important function of the undercoat dielectric layer is to reduce interfacial stresses at the undercoat dielectric layer/substrate interface. As used herein, "compliant thermal expansion coefficient" means a matching of thermal expansion coefficients between the metal or non-metal substrate and the dielectric multilayer that reduces interfacial stresses at the undercoat dielectric layer/substrate interface. Preferably, the thermal expansion coefficients of the metal or non-metal substrate and the dielectric multilayer are the same or substantially the same.

Examples of insulating materials that can be used in the undercoat layer of the dielectric multilayer include, for example, alumina, zirconia, aluminum nitride, silicon nitride, silicon dioxide, aluminum dioxide, tantalum pentoxide, silicon carbide, polyimide and the like. Examples of such insulating materials that can be used in the topcoat layer of the dielectric multilayer include, for example, yttria and the like. The high surface or contact resistivity between the body and the undercoat layer of the dielectric multilayer substantially prevents electrons from passing therebetween. Moreover, the low dielectric constant of the underlayer of the dielectric multilayer electrically insulates the chuck body from the surrounding structure and environment (e.g., process gases, plasma and other conductive pathways), thus minimizing electrical losses that may reduce the electrical potential between the electrostatic chuck and the substrate thereby resulting in reduction in the attractive forces.

The undercoat dielectric layer preferably comprises aluminum oxide, doped aluminum oxide, zirconium oxide, magnesium oxide, cerium oxide, hafnium oxide, gadolinium oxide, yttrium oxide, ytterbium oxide, oxides of Group 2A to 8B inclusive of the Periodic Table and the Lanthanide elements, aluminum nitride, or alloys or mixtures or composites thereof. The topcoat dielectric layer preferably comprises yttrium oxide, zirconium oxide, cerium oxide, hafnium oxide, oxides of Groups 2A to 8B inclusive of the Periodic Table and the Lanthanide elements, or alloys or mixtures or composites thereof. More preferably, the undercoat dielectric layer comprises aluminum oxide, and the topcoat dielectric layer comprises yttrium oxide.

In an embodiment, the dielectric multilayer is disposed on at least a portion of the chuck body. In another embodiment, the dielectric multilayer is disposed on all surfaces comprising the chuck body.

The dielectric multilayer may be applied to the chuck body using a variety of methods, e.g., thermal spray and sintering methods. In one embodiment, the dielectric multilayer is integrally fabricated to the body by plasma spraying.

In particular, the dielectric multilayer comprises (a) an undercoat dielectric layer comprising a metal oxide or metal nitride formed on a surface; and (b) a topcoat dielectric layer comprising a metal oxide formed on the undercoat dielectric layer. The undercoat dielectric layer has a resistivity greater than the resistivity of the topcoat dielectric layer. The topcoat dielectric layer has a corrosion resistance and/or plasma erosion resistance greater than the corrosion resistance and/or plasma erosion resistance of the undercoat dielectric layer. The topcoat dielectric layer has a dielectric constant greater than the dielectric constant of the undercoat dielectric layer. The undercoat dielectric layer has a porosity greater than the porosity of the topcoat dielectric layer.

Erosion and corrosion resistant properties of the dielectric multilayers of this invention can be further improved by blocking or sealing the inter-connected residual micro-porosity inherent in thermally sprayed dielectric multilayer coatings. Sealers can include hydrocarbon, siloxane, or polyimid based materials with out-gassing properties of less than 1% TML (total mass loss) and less than 0.05 CVCM (collected condensible volatile materials), preferably less than 0.5% TML, less than 0.02% CVCM. Sealants can also be advantageous in semiconductor device manufacture as sealed coatings on internal chamber components and electrostatics chucks will reduce chamber conditioning time when compared to as-coated or sintered articles. Conventional sealants can be used in the methods of this invention. The sealants can be applied by conventional methods known in the art.

The dielectric multilayer coatings of this invention can be prepared by a variety of methods well known in the art. These methods include thermal spray (plasma, HVOF, detonation gun, etc.), electron beam physical vapor deposition (EB-PVD), laser cladding; and plasma transferred arc. Thermal spray is a preferred method for deposition of ceramic powders to form the erosive and corrosive resistant dielectric multilayers of this invention. The erosion and corrosion resistant dielectric multilayers of this invention are formed from ceramic powders having the same composition. Such methods may also be used for deposition of the coating layers, e.g., undercoat layer and the topcoat layer, and for the deposition of continuously graded coatings wherein there are no discrete layers, but the coating is applied as a functional composite. The thermally spray coated substrate support member is preferably coated with an undercoat layer of aluminum oxide (i.e., alumina) and/or zirconium oxide (i.e., zirconia), or other rare earth oxides, and a topcoat layer of yttrium oxide (i.e., yttria), or other rare earth oxides.

The thermal spray dielectric multilayer coatings can be deposited onto a metal or non-metal substrate using any thermal spray device by conventional methods. Preferred thermal spray methods for depositing the ceramic coatings are plasma spraying including inert gas shrouded plasma spraying and low pressure or vacuum plasma spraying in chambers. Other deposition methods that may be useful in this invention include high velocity oxygen-fuel torch spraying, detonation gun coating and the like. The most preferred method is inert gas shrouded plasma spraying and low pressure or vacuum plasma spraying in chambers. It could also be advantageous to heat treat the ceramic coating using appropriate times and temperatures to achieve a good bond for the ceramic coating to the substrate and a high sintered density of the ceramic coating. Other means of applying a uniform deposit of powder to a substrate in addition to thermal spraying include, for example, electrophoresis, electroplating and slurry deposition.

The method of this invention preferably employs plasma spray methodology. The plasma spraying is suitably carried out using fine agglomerated powder particle sizes, typically having an average agglomerated particle size of less than about 50 microns, preferably less than about 40 microns, and more preferably from about 5 to about 50 microns. Individual particles useful in preparing the agglomerates typically range in size from nanocrystalline size to about 5 microns in size. The plasma medium can be nitrogen, hydrogen, argon, helium or a combination thereof.

The thermal content of the plasma gas stream can be varied by changing the electrical power level, gas flow rates, or gas composition. Argon is usually the base gas, but helium, hydrogen and nitrogen are frequently added. The velocity of the plasma gas stream can also be varied by changing the same parameters.

Variations in gas stream velocity from the plasma spray device can result in variations in particle velocities and hence dwell time of the particle in flight. This affects the time the particle can be heated and accelerated and, hence, its maximum temperature and velocity. Dwell time is also affected by the distance the particle travels between the torch or gun and the surface to be coated.

The specific deposition parameters depend on both the characteristics of the plasma spray device and the materials being deposited. The rate of change or the length of time the parameters are held constant are a function of both the required dielectric multilayer coating composition, the rate of traverse of the gun or torch relative to the surface being coated, and the size of the part. Thus, a relatively slow rate of change when coating a large part may be the equivalent of a relatively large rate of change when coating a small part.

The dielectric multilayer may also be applied to the electrostatic chuck body by sintering. The sintering can be conducted by conventional methods known in the art. See, for example, U.S. Pat. No. 7,442,450 B2, the disclosure of which is incorporated herein by reference. For high temperature applications, thermal spray methods are preferable over sintering in order to achieve porosity in the undercoat dielectric layer and to provide a compliant thermal expansion coefficient between the base body and the dielectric multilayer.

As indicated above, a suitable thickness for the dielectric multilayers of this invention can range from about 0.005 to about 0.02 inches depending on any allowance for dimensional grinding, the particular application and the thickness of any other layers. For typical applications and erosive and corrosive environments, the dielectric multilayer thickness may range from about 0.007 to about 0.012 inches, but thicker coatings will be needed to accommodate reduction in final thickness by any abrading procedure. In other words, any such abrading procedure will reduce the final thickness of the coating.

A suitable thickness for the undercoat layer of the dielectric multilayer of this invention can range from about 0.005 to about 0.016 inches depending on any allowance for dimensional grinding, the particular application and the thickness of any other layers. For typical applications and erosive and corrosive environments, the undercoat layer coating thickness may range from about 0.008 to about 0.01 inches, but thicker coatings will be needed to accommodate reduction in final thickness by any abrading procedure. In other words, any such abrading procedure will reduce the final thickness of the coating.

A suitable thickness for the topcoat layer of the dielectric multilayer of this invention can range from about 0.005 to about 0.016 inches depending on any allowance for dimensional grinding, the particular application and the thickness of any other layers. For typical applications and erosive and corrosive environments, the topcoat layer coating thickness may range from about 0.008 to about 0.01 inches, but thicker coatings will be needed to accommodate reduction in final thickness by any abrading procedure. In other words, any such abrading procedure will reduce the final thickness of the coating.

Illustrative metallic and non-metallic substrate support member, e.g., electrostatic chuck, substrates include, for example, aluminum and its alloys, typified by aluminum 6061 in the T6 condition and sintered aluminum oxide. Other illustrative substrates include various steels inclusive of stainless steel, nickel, iron and cobalt based alloys, tungsten and tungsten alloy, titanium and titanium alloy, molybdenum and molybdenum alloy, and certain non-oxide sintered ceramics, and the like.

In an embodiment, an aluminum substrate support member can be anodized prior to applying the dielectric multilayer. A few metals can be anodized but aluminum is the most common. Anodization is a reaction product formed in situ by anodic oxidation of the substrate by an electrochemical process. The anodic layer formed by anodization is aluminum oxide which is a ceramic.

The substrate support member can comprise a substrate support body, a metal oxide coating applied on the surface thereof as an undercoat, and another metal oxide coating applied on the undercoat as a topcoat. In such a coating, the undercoat can comprise aluminum oxide or a mixture of aluminum oxide and zirconium oxide or yttrium oxide, and the topcoat can be preferably yttrium oxide. The undercoat and topcoat can be applied by a chemical vapor deposition process, a physical vapor deposition process, a thermal spray process or an electrochemical growth process. The undercoat and topcoat can also be formed by sintering.

Other suitable metal substrates include, for example, nickel base superalloys, nickel base superalloys containing titanium, cobalt base superalloys, and cobalt base superalloys containing titanium. Preferably, the nickel base superalloys would contain more than 50% by weight nickel and the cobalt base superalloys would contain more than 50% by weight cobalt. Illustrative non-metal substrates include, for example, permissible silicon-containing materials.

As indicated above, this invention relates to a method for protecting a substrate support. The substrate support comprises a base body, and one or more conductive members disposed on or within the base body. The method comprises forming a dielectric multilayer on at least a portion of the base body, or on the one or more conductive members disposed on the base body and at least a portion of the base body. The dielectric multilayer comprises (a) an undercoat dielectric layer comprising a metal oxide or metal nitride formed on at least a portion of the base body, or on the one or more conductive members disposed on the base body and at least a portion of the base body; and (b) a topcoat dielectric layer comprising a metal oxide formed on the undercoat dielectric layer. The topcoat dielectric layer has an aluminum oxide content of less than about 1 weight percent, preferably less than about 0.5 weight percent, and more preferably less than about 0.1 weight percent. The topcoat dielectric layer has a corrosion resistance and/or plasma erosion resistance greater than the corrosion resistance and/or plasma erosion resistance of the undercoat dielectric layer. The undercoat dielectric layer can have a resistivity greater than the resistivity of the topcoat dielectric layer. The topcoat dielectric layer can have a dielectric constant greater than the dielectric constant of the undercoat dielectric layer. The undercoat dielectric layer can have a porosity greater than the porosity of the topcoat dielectric layer.

As also indicated above, this invention relates to a method for producing a substrate support. The method comprises (a) providing a base body, and one or more conductive members disposed on or within the base body; and (b) forming a dielectric multilayer on at least a portion of the base body, or on the one or more conductive members disposed on the base body and at least a portion of the base body. The dielectric multilayer comprises (i) an undercoat dielectric layer comprising a metal oxide or metal nitride formed on at least a portion of the base body, or on the one or more conductive members disposed on the base body and at least a portion of the base body; and (ii) a topcoat dielectric layer comprising a metal oxide formed on the undercoat dielectric layer. The topcoat dielectric layer has an aluminum oxide content of less than about 1 weight percent, preferably less than about 0.5 weight percent, and more preferably less than about 0.1 weight percent. The topcoat dielectric layer has a corrosion resistance and/or plasma erosion resistance greater than the corrosion resistance and/or plasma erosion resistance of the undercoat dielectric layer. The undercoat dielectric layer can have a resistivity greater than the resistivity of the topcoat dielectric layer. The topcoat dielectric layer can have a dielectric constant greater than the dielectric constant of the undercoat dielectric layer. The undercoat dielectric layer can have a porosity greater than the porosity of the topcoat dielectric layer.

The coated substrate support members of this invention can be prepared by flowing powder through a thermal spraying device that heats and accelerates the powder onto a base (substrate). Upon impact, the heated particle deforms resulting in a thermal sprayed lamella or splat. Overlapping splats make up the coating structure. A plasma spray process useful in this invention is disclosed in U.S. Pat. No. 3,016,447, the disclosure of which is incorporated herein by reference. A detonation process useful in this invention is disclosed in U.S. Pat. Nos. 4,519,840 and 4,626,476, the disclosures of which are incorporated herein by reference, which include coatings containing tungsten carbide cobalt chromium compositions. U.S. Pat. No. 6,503,290, the disclosure of which is incorporated herein by reference, discloses a high velocity oxygen fuel process that may be useful in this invention to coat substrate supports. Cold spraying methods known in the art may also be useful in this invention. Typically, such cold spraying methods use liquid helium gas which is expanded through a nozzle and allowed to entrain powder particles. The entrained powder particles are then accelerated to impact upon a suitably positioned workpiece.

In coating the substrate support members of this invention, the thermal spraying powder is thermally sprayed onto the surface of the substrate support member, and as a result, a thermal sprayed dielectric multilayer coating is formed on the surface of the substrate support member. High-velocity-oxygen-fuel or detonation gun spraying are illustrative methods of thermally spraying the thermal spraying powder. Other coating formation processes include plasma spraying, plasma transfer arc (PTA), or flame spraying. For electronics applications, plasma spraying is preferred for topcoat dielectric yttria coatings and undercoat dielectric alumina coatings because there is no hydrocarbon combustion and therefore no source of contamination. Plasma spraying uses clean electrical energy.

As indicated above, this invention relates to a method for producing an electronic device, e.g., an integrated circuit component. The method comprises: (a) providing an electrostatic chuck; (b) providing a workpiece overlying a work surface of the electrostatic chuck; (c) providing a voltage across the electrostatic chuck and the workpiece to maintain the workpiece in proximity to the work surface; and (d) processing the workpiece to produce an electronic device. The electrostatic chuck comprises (i) a base body; (ii) one or more conductive members disposed on or within the base body; and (iii) a dielectric multilayer formed on at least a portion of the base body, or on the one or more conductive members disposed on the base body and at least a portion of the base body. The dielectric multilayer comprises (a') an undercoat dielectric layer comprising a metal oxide or metal nitride formed on at least a portion of the base body, or on the one or more conductive members disposed on the base body and at least a portion of the base body; and (b') a topcoat dielectric layer comprising a metal oxide formed on the undercoat dielectric layer. The topcoat dielectric layer has an aluminum oxide content of less than about 1 weight percent, preferably less than about 0.5 weight percent, and more preferably less than about 0.1 weight percent. The topcoat dielectric layer has a corrosion resistance and/or plasma erosion resistance greater than the corrosion resistance and/or plasma erosion resistance of the undercoat dielectric layer. The undercoat dielectric layer can have a resistivity greater than the resistivity of the topcoat dielectric layer. The topcoat dielectric layer can have a dielectric constant greater than the dielectric constant of the undercoat dielectric layer. The undercoat dielectric layer can have a porosity greater than the porosity of the topcoat dielectric layer. The electrostatic chuck has a work surface on which a workpiece can be supported. The workpiece can comprise, for example, a semiconductor wafer, a metallic wafer, or a glass plate.

This invention is generally applicable to substrate support components subjected to corrosive environments such as substrate support member components for plasma treating vessels. This invention provides corrosive barrier systems that are suitable for protecting the surfaces of such substrate support member components. While the advantages of this invention will be described with reference to substrate support member components, the teachings of this invention are generally applicable to any component on which a corrosive barrier coating may be used to protect the component from a corrosive environment.

According to this invention, substrate support member components intended for use in corrosive environments of plasma treating vessels are thermal spray coated with a protective coating layer. The thermal sprayed coated substrate support member component formed by the method of this invention can have desired corrosion resistance, plasma erosion resistance, and wear resistance.

The dielectric multilayers of this invention are useful for chemical processing equipment used at low and high temperatures, e.g., in harsh erosive and corrosive environments. In harsh environments, the equipment can react with the material being processed therein. Ceramic materials that are inert towards the chemicals can be used as coatings on the metallic equipment components. The ceramic coatings should be impervious to prevent erosive and corrosive materials from reaching the metallic equipment. A coating which can be inert to such erosive and corrosive materials and prevent the erosive and corrosive materials from reaching the underlying substrate will enable the use of less expensive substrates and extend the life of the equipment components.

The dielectric multilayers of this invention show desirable resistance when used in an environment subject to plasma erosion action in a gas atmosphere containing a halogen gas. For example, even when plasma etching operation is continued over a long time, the contamination through particles in the deposition chamber is less and a high quality substrate support member component can be efficiently produced. By the practice of this invention, the rate of generation of particles in a plasma process chamber can become slower, so that the interval for the cleaning operation becomes longer increasing productivity. As a result, the coated substrate support members of this invention can be effective in a plasma treating vessel in a semiconductor production apparatus.

Various modifications and variations of this invention will be obvious to a worker skilled in the art and it is to be understood that such modifications and variations are to be included within the purview of this application and the spirit and scope of the claims.

EXAMPLE 1

Four different electrostatic chucks (ESCs) for a 300 mm wafer were fabricated to compare chucking force. The four ESCs are shown in cross section in FIG. 1. ESC #1 and ESC #2 were one test set and ESC #3 and ESC #4 were another test set. ESC #1 was coated with an $Al_2O_3$ undercoat layer (9 mils) and an $Al_2O_3$ topcoat layer (3 mils). ESC #2 was coated with an $Al_2O_3$ undercoat layer (9 mils) and a $Y_2O_3$ topcoat layer (3 mils). ESC #3 was coated with a single $Al_2O_3$ layer (9 mils). ESC #4 was coated with an $Al_2O_3$ undercoat layer (7 mils) and a $Y_2O_3$ topcoat layer (2 mils).

In order to make sure that the factors affecting on chucking force such as surface roughness of the ESC surface contacting the wafer and contact ratio with the wafer, the resistance of each layer and thickness were checked before the chucking force was measured.

Figure 2:
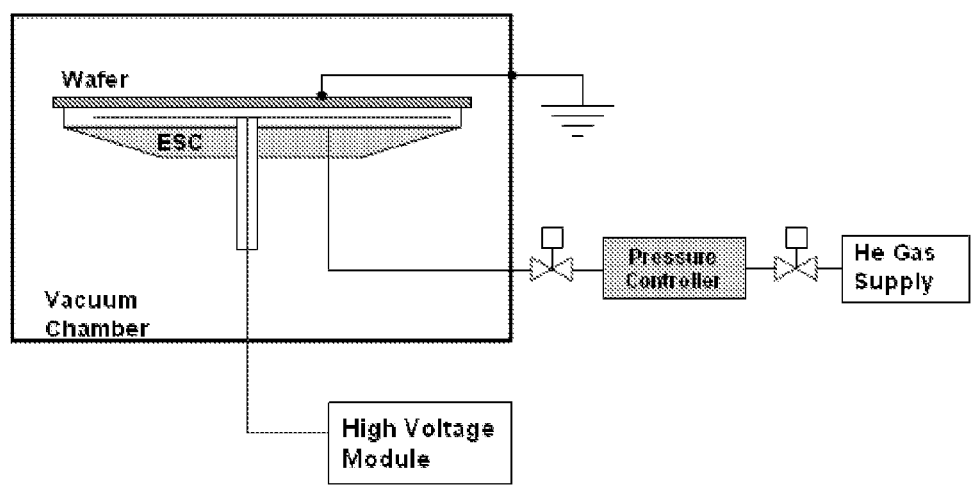
FIG. 2 depicts a system used to measure chucking force in Example 1. Gas is introduced in between the wafer and each ESC and the flow rate of the gas leaking through the periphery of the wafer is measured in vacuum chamber.

In order to measure the chucking force, gas was introduced in between the wafer and each ESC and the flow rate of the gas leaking through the periphery of the wafer was measured in vacuum chamber as shown in FIG. 2.

From a high voltage module, 2 KV was applied to the electrode embedded in ceramic layer. The wafer was connected with the chamber wall that was ground to complete a circuit creating an electrostatic force. After electrostatic force was generated, helium gas (30T) was introduced to the backside of wafer and its flow rate was measured. The pressure of the vacuum chamber was maintained less than 1 m Torr. The helium leak rate for each ESC is shown in Table A below. In first set test, helium leak improved 31% (i.e., ESC#2 versus ESC#1) and the second test set, it was improved 21% (i.e., ESC#4 versus ESC#3). The current leakage from the ESC to the chamber wall also measured. As shown in Table A, for all ESCs, the current leakage was less than 1 micro amps. This means that there was no Johnsen-Rahbek effect, thereby a much smaller helium leak rate.

TABLE A

| ESC # | He leak rate (sccm) | Current leakage |
| --- | --- | --- |
| 1 | 2.8 | <1 uA |
| 2 | 1.6 | <1 uA |
| 3 | 1.4 | <1 uA |
| 4 | 1.1 | <1 uA |

Figure 3:
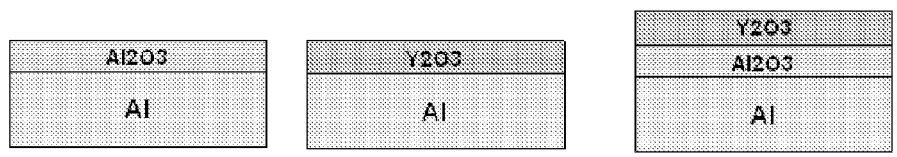
FIG. 3 depicts samples that were prepared in Example 1 having Al2O3 coated by plasma spraying on aluminum (Al), Y2O3 coated by plasma spraying on aluminum (Al), and the combination Al2O3+Y2O3 layer coated by plasma spraying on aluminum (Al).

Resistivity and dielectric constant were measured. As shown in FIG. 3, samples were prepared having $Al_2O_3$ coated by plasma spraying on aluminum (Al), $Y_2O_3$ coated by plasma spraying on aluminum (Al), and the combination $Al_2O_3+Y_2O_3$ layer coated by plasma spraying on aluminum (Al). The resistivity and dielectric properties were measured and are shown in Table B below.

TABLE B

| Sample | Volume Resistivity (Ω cm) | Dielectric constant |
| --- | --- | --- |
| $Al_2O_3$ | 2.0E+16 | 7 |
| $Y_2O_3$ | 7.5E+15 | 8.4 |
| $Al_2O_3+Y_2O_3$ | 1.3E+16 | 7.2 |

From Tables A and B above, resistivity of the dual layer is correspondent with current leakage less than 1 micro amp that was obtained. But dielectric constant can not explain the improved chucking force using the conventional chucking force formula in which the chucking force generated between two parallel plates is proportional to the capacitance of the dielectric between the two plates. Based on the dielectric constant in Table B, the capacitance of the combination $Al_2O_3+Y_2O_3$ layer was improved 2.3% compared to the single $Al_2O_3$ layer. Therefore, the chucking force would be expected to be almost same with the single $Al_2O_3$ layer, but the actual ESC showed about 20 to about 30% improved chucking force obtained from the single $Y_2O_3$ layer that has 20% higher dielectric constant than the $Al_2O_3$ layer. This means that the chucking force of a combined material made of more than two different materials is proportional to dielectric constant of a material adjacent to the wafer.

Another test was conducted to determine if chucking force remains even after turning off the high voltage source. The test was conducted as follows:
1) measure flow rate at 5 Torr without wafer;
2) apply 2 kV for 50 seconds, with backside helium supplied;
3) turn off the voltage but maintain helium pressure;
4) when helium flow becomes the flow rate recorded step 1, the release time was recorded; this was repeated 4 times and the release time was less than 1 second each time.

From the above, it is shown that the chucking force is proportional to the dielectric constant of the material adjacent to wafer, i.e., $Y_2O_3$, and not to the overall dielectric constant of the combination $Al_2O_3+Y_2O_3$ coating layer. This makes it possible to improve chucking force without compromising resistivity and thickness of the dielectric. For example, when the single $Y_2O_3$ layer is used, it allows current to flow through it and generates a Johnsen-Rahbek effect causing not only higher chucking force but also dechucking issue. In contrast, the combination $Al_2O_3+Y_2O_3$ coating layer keeps its resistivity higher than 1E+16 as shown in Table B, not allowing current draw but generating chucking force as high as the single $Y_2O_3$ layer.

EXAMPLE 2

Figure 4:
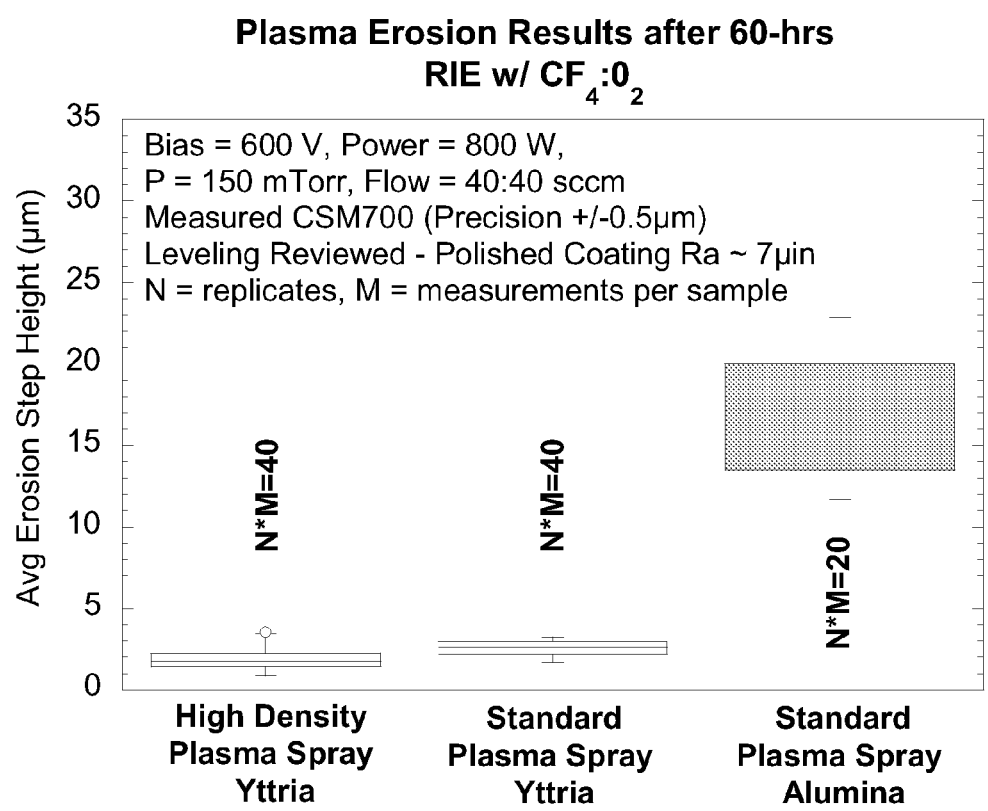
FIG. 4 is a graphical representation of plasma erosion results after 60 hours of exposure with $CF_4/O_2$ reactive ion etching (RIE). The plasma erosion results were measured in Example 2.

Plasma resistance was determined for the yttria topcoat layer. The measurement technique utilized to obtain this data was very precise, i.e., +/−0.5 micrometers. A Zeiss Confocal microscope (CSM 700) was used to measure the step height. Coating surfaces were polished to very smooth finishes (i.e., about 7 microns) in order to ensure the step height due to plasma erosion could clearly be differentiated. The number of measurements per sample and the number of replicates are provided in FIG. 4. The magnitudes measured were after 60 total hours of exposure. The data shows that yttria erodes about 2-3 micrometers after 60 hours of exposure with $CF_4/O_2$ reactive ion etching (RIE). In comparison, the data shows that alumina erodes about 16 micrometers after 60 hours with $CF_4/O_2$ RIE. This amounts to an erosion rate of about 5-8× greater for alumina as compared to yttria.

EXAMPLE 3

$Al_2O_3$ is typically used for parts exposed to plasma in a plasma process chamber. The reaction of $Al_2O_3$ with gases including fluorine (e.g., $NF_4$ or $CF_4$ to be used for cleaning in a deposition process and etchant in an etch process) produces AlF on the $Al_2O_3$ surface. This causes a particle issue resulting in changes in material properties and process drift with time. In accordance with this invention, a $Y_2O_3$ coating on top of $Al_2O_3$ can be used as the dielectric material for an ESC. A $Y_2O_3$ coating on top of $Al_2O_3$ is also desirable because $Y_2O_3$ does not react with fluorine.

The invention claimed is:
1. A substrate support comprising (i) a base body; (ii) one or more conductive members disposed on or within the base body; and (iii) a dielectric multilayer formed on at least a portion of the base body, or on the one or more conductive members disposed on the base body and at least a portion of the base body; wherein the dielectric multilayer comprises (a) an undercoat dielectric layer comprising a metal oxide or metal nitride formed on at least a portion of the base body, or on the one or more conductive members disposed on the base body and at least a portion of the base body; and (b) a topcoat dielectric layer comprising a metal oxide formed on the undercoat dielectric layer; wherein (i') the topcoat dielectric layer has an aluminum oxide content of less than about 1 weight percent, and (ii') the topcoat dielectric layer has a corrosion resistance and/or plasma erosion resistance greater than the corrosion resistance and/or plasma erosion resistance of the undercoat dielectric layer, and
   wherein the topcoat dielectric layer has a lower porosity than the undercoat dielectric layer.
2. The substrate support of claim 1 which comprises an electrostatic chuck.

3. The substrate support of claim 1 wherein the undercoat dielectric layer has a resistivity greater than the resistivity of the topcoat dielectric layer.

4. The substrate support of claim 2 wherein the electrostatic chuck generates a chucking force through a Coulombic or a Johnsen-Rahbek effect.

5. The substrate support of claim 1 wherein the topcoat dielectric layer has a dielectric constant sufficient to increase polarization of dipoles inside of the topcoat dielectric layer to increase chucking force.

6. The substrate support of claim 1 wherein the undercoat dielectric layer has a porosity sufficient to provide a compliant thermal expansion coefficient between the base body and the dielectric multilayer.

7. The substrate support of claim 1 wherein the undercoat dielectric layer has a resistivity greater than about 10E16 ohms-cm when said substrate support is adapted to make use of a Coulombic force, and a resistivity of from about 10E11 ohms-cm to about 10E14 ohms-cm when said substrate support is adapted to make use of a Johnsen-Rahbek force.

8. The substrate support of claim 1 wherein the undercoat dielectric layer has a porosity greater than about 5 volume percent.

9. The substrate support of claim 1 wherein the topcoat dielectric layer has a dielectric constant greater than about 8.

10. The substrate support of claim 1 wherein the undercoat dielectric layer comprises aluminum oxide, zirconium oxide, magnesium oxide, cerium oxide, hafnium oxide, gadolinium oxide, yttrium oxide, ytterbium oxide, aluminum nitride, oxides of Group 2A to 8B inclusive of the Periodic Table and the Lanthanide elements, or alloys or mixtures or composites thereof.

11. The substrate support of claim 1 wherein the topcoat dielectric layer comprises yttrium oxide, zirconium oxide, cerium oxide, hafnium oxide, oxides of Groups 2A to 8B inclusive of the Periodic Table and the Lanthanide elements, or alloys or mixtures or composites thereof.

12. The substrate support of claim 1 wherein the one or more conductive members disposed on or within the base body comprise one or more electrodes.

13. The substrate support of claim 1 in which the base body is constructed of aluminum or its alloys or sintered aluminum oxide.

14. The substrate support of claim 1 which has a support surface on which a substrate can be supported, wherein the substrate comprises a semiconductor wafer, a metallic wafer, or a glass plate.

15. The substrate support of claim 1 wherein the dielectric multilayer is applied by a plasma coating method, a high-velocity oxygen fuel coating method, a detonation coating method, a cold spraying method, or a sintering method.

16. The substrate support of claim 1 wherein the undercoat dielectric layer comprises aluminum oxide, and the topcoat dielectric layer comprises yttrium oxide.

17. The substrate support of claim 1 wherein the undercoat dielectric layer comprises aluminum oxide, doped aluminum oxide or aluminum nitride, and the topcoat dielectric layer comprises yttrium oxide.

18. The substrate support of claim 1 comprising a plasma sprayed ceramic undercoat dielectric coating applied to said substrate support, and a plasma sprayed ceramic topcoat dielectric coating applied to said undercoat coating.

19. The substrate support of claim 18 wherein the plasma spraying is selected from inert gas shrouded plasma spraying and low pressure or vacuum plasma spraying in chambers.

20. The substrate support of claim 1 wherein the dielectric multilayer has a thickness of from about 0.005 to about 0.02 inches.

21. The substrate support of claim 1 wherein the undercoat dielectric layer has a thickness of from about 0.005 to about 0.016 inches, and the topcoat dielectric layer has a thickness of from about 0.005 to about 0.016 inches.

22. A method for producing a substrate support comprising (a) providing a base body, and one or more conductive members disposed on or within the base body; and (b) forming a dielectric multilayer on at least a portion of the base body, or on the one or more conductive members disposed on the base body and at least a portion of the base body; wherein the dielectric multilayer comprises (i) an undercoat dielectric layer comprising a metal oxide or metal nitride formed on at least a portion of the base body, or on the one or more conductive members disposed on the base body and at least a portion of the base body; and (ii) a topcoat dielectric layer comprising a metal oxide formed on the undercoat dielectric layer; wherein (a') the topcoat dielectric layer has an aluminum oxide content of less than about 1 weight percent, and (b') the topcoat dielectric layer has a corrosion resistance and/or plasma erosion resistance greater than the corrosion resistance and/or plasma erosion resistance of the undercoat dielectric layer, and wherein the topcoat dielectric layer has a lower porosity than the undercoat dielectric layer.

23. A method for producing an electronic device, said method comprising: (a) providing an electrostatic chuck comprising (i) a base body;

(ii) one or more conductive members disposed on or within the base body; and (iii) a dielectric multilayer formed on at least a portion of the base body, or on the one or more conductive members disposed on the base body and at least a portion of the base body; wherein the dielectric multilayer comprises (a') an undercoat dielectric layer comprising a metal oxide or metal nitride formed on at least a portion of the base body, or on the one or more conductive members disposed on the base body and at least a portion of the base body; and (b') a topcoat dielectric layer comprising a metal oxide formed on the undercoat dielectric layer; wherein (i') the topcoat dielectric layer has an aluminum oxide content of less than about 1 weight percent, and (ii') the topcoat dielectric layer has a corrosion resistance and/or plasma erosion resistance greater than the corrosion resistance and/or plasma erosion resistance of the undercoat dielectric layer; (b) providing a workpiece overlying the work surface; (c) providing a voltage across the electrostatic chuck and the workpiece to maintain the workpiece in proximity to the work surface; and (d) processing the workpiece to produce an electronic device, and wherein the topcoat dielectric layer has a lower porosity than the undercoat dielectric layer.

24. The substrate support of claim 1, wherein the undercoat dielectric layer has a higher electrical resistivity than the topcoat dielectric layer, and the topcoat dielectric layer has at least one of a higher plasma resistance and a higher chemical corrosion resistance than the undercoat dielectric layer.

25. The substrate support of claim 1, wherein the topcoat dielectric layer has a higher dielectric constant than the undercoat dielectric layer.

* * * * *